(12) United States Patent
Mueller et al.

(10) Patent No.: US 12,039,403 B2
(45) Date of Patent: Jul. 16, 2024

(54) SEMI-ACTIVE MAGNETIC SHIELDING FOR QUBIT UNIT COMPONENTS OF QUANTUM COMPUTING APPARATUSES

(71) Applicant: International Business Machines Corporation, Armonk, NY (US)

(72) Inventors: Peter Mueller, Zurich (CH); Thomas Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 866 days.

(21) Appl. No.: 17/129,977

(22) Filed: Dec. 22, 2020

(65) Prior Publication Data

US 2022/0198310 A1    Jun. 23, 2022

(51) Int. Cl.
*G01R 33/00* (2006.01)
*G01R 33/035* (2006.01)
*G06N 10/00* (2022.01)

(52) U.S. Cl.
CPC ......... *G06N 10/00* (2019.01); *G01R 33/0076* (2013.01); *G01R 33/035* (2013.01)

(58) Field of Classification Search
CPC .. G01R 33/0076; G01R 33/035; G01R 33/00; G06N 10/00; G06N 10/40; H05K 9/0071
USPC .......................................................... 361/146
See application file for complete search history.

(56) References Cited

U.S. PATENT DOCUMENTS 6,420,868 B1   7/2002   Ganther, Jr.
8,247,799 B2   8/2012   Bunyk
2017/0071082 A1*   3/2017   Sadleir ................. H05K 9/0077
2018/0054201 A1*   2/2018   Reagor ............... H03K 19/195
2018/0330267 A1   11/2018   Rigetti
2019/0182995 A1   6/2019   Sterling

FOREIGN PATENT DOCUMENTS

CN   209376128 U   *   9/2019  .......... H05K 9/0007
CN   110426316 A   *   11/2019  ............. G01M 3/26
CN   116783599 A   9/2023
EP   4268146 A1   11/2023

(Continued)

OTHER PUBLICATIONS

Dev & Op of Mini Ion Traps for Scalable Quantum Computation _Splat_1-109_Aug. 2009.*

(Continued)

*Primary Examiner* — Timothy J Thompson
*Assistant Examiner* — Guillermo J Egoavil
(74) *Attorney, Agent, or Firm* — Daniel J Blabolil

(57) ABSTRACT

A computer-implemented method of reducing an impact of stray magnetic fields on components of a quantum computing chip is disclosed. The computer implemented method includes applying a first current signal to a first component of a quantum computing chip, whereby the first component generates a stray magnetic field impacting an operation of a second component of the quantum computing chip. The computer implemented method further includes applying a compensation current signal to a shielding circuit of the quantum computing chip, the compensation current signal generated according to a predetermined function of the first signal, to magnetically shield the second component from the stray magnetic field generated by the first component.

20 Claims, 9 Drawing Sheets

(56) References Cited

FOREIGN PATENT DOCUMENTS

| JP | 2023554256 A | 12/2023 |
|---|---|---|
| WO | 2022136350 A1 | 6/2022 |

OTHER PUBLICATIONS

Quantum Sensing Exp With Superconducting Qubits_Schneider_1-153_Jan. 2020.*

Belfi et al., "Stray magnetic field compensation with a scalar atomic magnetometer", Rev. Sci. Instrum. 81, 065103 (2010); https://doi.org/10.1063/1.3441980, Submitted: Mar. 10, 2010, Accepted: May 8, 2010, Published Online: Jun. 23, 2010, 8 pages.

Brandl et al., Cryogenic setup for trapped ion quantum computing, 12 pages, arXiv:1607.04980v1 [quant-ph] Jul. 18, 2016.

Dedman et al., "Active cancellation of stray magnetic fields in a Bose-Einstein condensation experiment", Rev. Sci. Instrum. 78, 024703 (2007); https://doi.org/10.1063/1.2472600, Submitted: Oct. 26, 2006, Accepted: Jan. 14, 2007, Published Online: Feb. 22, 2007, 7 pages.

Del Cima et al., "Magnetic shielding of quantum entanglement states", 7 pages, arXiv:1803.01241v2 [quant-ph] Oct. 6, 2018.

Fluhmann, Christa, "Stabilizing lasers and magnetic fields for quantum information experiments", Master thesis, Mar. 31, 2014, 49 pages, Swiss Federal Institute of Technology, Institute for Quantum Electronics, Trapped Ion Quantum Information.

Fowler et al., "Surface codes: Towards practical large-scale quantum computation", Phys. Rev. A 86, 032324—Published Sep. 18, 2012, 54 pages.

Gambetta et al., "Building logical qubits in a superconducting quantum computing system", arXiv:1510.04375v1 quant-ph] Oct. 15, 2015, 10 pages.

Ganzhorn et al., "Gate-efficient simulation of molecular eigenstates on a quantum computer", arXiv:1809.05057v1 [quant-ph] Sep. 13, 2018, 20 pages.

Highstrete et al., "Technology for On-Chip Qubit Control with Microfabricated Surface Ion Traps", Sandia Report, SAND2013-9513, Unlimited Release, Printed Nov. 2013, Sandia National Laboratories Albuquerque, New Mexico 87185, 44 pages.

Lekitsch et al., "Blueprint for a microwave trapped ion quantum computer", Science Advances, Research Article, 2017; 3: e1601540, Feb. 1, 2017, pp. 1-11.

Nissen et al., "Quantum Leap", Ansys Advantage, Issue 2, 2016, 3 pages.

Roth et al., "Erratum: Analysis of a parametrically driven exchange-type gate and a two-photon excitation gate between superconducting qubits [Phys. Rev. A 96, Jun. 23, 2023 (2017)]", Received Apr. 13, 2018: published Apr. 24, 2018, Physical Review A 97, 049903(E) (2018), 1 page, ©2018 American Physical Society.

Sun et al., "Active magnetic field canceling system", 2013 9th International Workshop on Electromagnetic Compatibility of Integrated Circuits (EMC Compo), Dec. 15-18, Nara. Japan, 4 pages.

Belfi et al., "Stray Magnetic Field Compensation with a Scalar Atomic Magnetometer", arXiv:1003.1290v2 [physics.ins-det] Jun. 16, 2010, 8 pages.

International Search Report and Written Opinion, International Application No. PCT/EP2021/086952, International Filing Date Dec. 21, 2021.

IP Australia, "Examination report No. 1 for standard patent application," IP Australia, Apr. 12, 2024, 3 pages, AU Application No. 2021405238.

* cited by examiner

SEMI-ACTIVE MAGNETIC SHIELDING FOR QUBIT UNIT COMPONENTS OF QUANTUM COMPUTING APPARATUSES

BACKGROUND

The present invention relates in general to quantum processing apparatuses and methods of operation of such apparatuses. In particular, it is directed to a method of operating a quantum processing apparatus, where a compensation current signal is applied to a shielding circuit to magnetically shield a given component of a qubit chip from the stray magnetic field generated by a neighboring component on the qubit chip.

Recent advances in quantum enhanced sensing and quantum computing are making these technologies ever more relevant to industrial applications. Both quantum sensing and quantum computing make direct use of quantum-mechanical phenomena, such as superposition and entanglement. Quantum sensing aims at enhancing the precision of a measurement apparatus, whereas quantum computers perform operations on data entanglement. Superconducting circuits are relatively easy to manufacture with current technologies and are thus promising candidates to further scale quantum information technologies. Quantum computers are already available, which involve superconducting qubits with limited to no error correction. Such quantum computers are able to simulate systems intractable to conventional computers.

SUMMARY

According to one embodiment of the present invention, a computer-implemented method of reducing an impact of stray magnetic fields on components of a quantum computing chip is disclosed. The computer implemented method includes applying a first current signal to a first component of a quantum computing chip, whereby the first component generates a stray magnetic field impacting an operation of a second component of the quantum computing chip. The computer implemented method further includes applying a compensation current signal to a shielding circuit of the quantum computing chip, the compensation current signal generated according to a predetermined function of the first signal, to magnetically shield the second component from the stray magnetic field generated by the first component.

According to another embodiment of the present invention, a computer system for reducing an impact of stray magnetic fields on components of a quantum computing chip is disclosed. The computer system includes one or more computer processors, one or more computer readable storage media, and computer program instructions, the computer program instructions being stored on the one or more computer readable storage media for execution by the one or more computer processors. The program instructions include instructions to apply a first current signal to a first component of a quantum computing chip to operate the first component, whereby operation of the first component generates a stray magnetic field impacting an operation of a second component of the quantum computing chip. The program instructions further include instructions to apply a compensation current signal to a shielding circuit of the quantum computing chip that, the compensation current signal generated according to a predetermined function of the first signal, to magnetically shield the second component from the stray magnetic field generated by the first component.

According to another embodiment of the present invention, a quantum computing for reducing an impact of stray magnetic fields on components of a quantum computing chip is disclosed. The quantum computing apparatus includes a qubit unit including a shielding circuit, a first component, and a second component. The quantum computing apparatus further includes a control unit operatively connected to each of the first component and the shielding circuit, to apply: (i) a first current signal to a first component of a quantum computing chip to operate the first component, whereby operation of the first component generates a stray magnetic field impacting an operation of a second component of the quantum computing chip, and (ii) a compensation current signal to a shielding circuit of the quantum computing chip, the compensation current signal generated according to a predetermined function of the first signal, to magnetically shield the second component from the stray magnetic field generated by the first component.

Apparatuses and methods embodying the present invention will now be described, by way of non-limiting examples, and in reference to the accompanying drawings.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying figures.

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure.

FIG. 2 is similar to FIG. 1, except that it additionally involves a shielding circuit that includes a compensation loop surrounding a component of the qubit unit, to shield this component from stray magnetic fields generated by a neighboring component.

FIG. 3A shows contours of the magnetic field intensity in absence of any magnetic shielding, whereas FIG. 3B show contours of the magnetic field intensity when the stray field generated by the LHS component is locally shielded at the level of the right-hand side (RHS) component by applying a compensation current signal to a loop of the shielding circuit that surrounds the RHS component.

FIG. 5A shows a configuration, in which the compensation circuit loop and the additional loops are all connected in parallel with a first circuit of the field-emitting component. In FIG. 5B, the additional loops of the shaping circuit are connected in series with the first circuit, while the compensation circuit loop is connected in parallel with the first circuit. FIGS. 5C and 5D show variants, in which all the loops are connected in series with the first circuit of the field-emitting component.

FIG. 7A shows a qubit chip including a shielding circuit coiled around each of the computational qubits, whereas FIG. 7B shows a shielding circuit coiled around the sole tunable coupler. In both cases, the shielding circuit shields the computational qubits from the stray magnetic field generated by the tunable coupler, according to embodiments of the present invention.

Figure 7A:
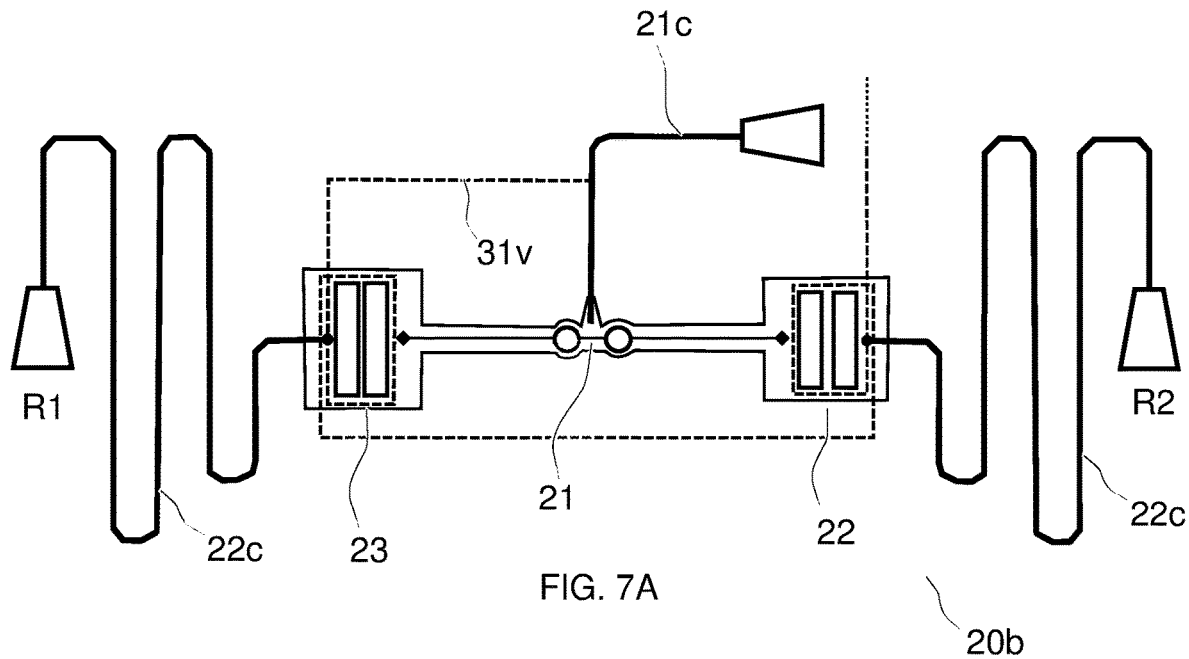
FIGS. 7A and 7B are illustrations of actual superconducting qubit chip layouts in accordance with various embodiments of the present invention, in which two transmon-type, computational qubits are coupled via a tunable coupler, whereby the computational qubits may undergo stray magnetic fields emitted by the tunable coupler, in operation.
Figure 7B:
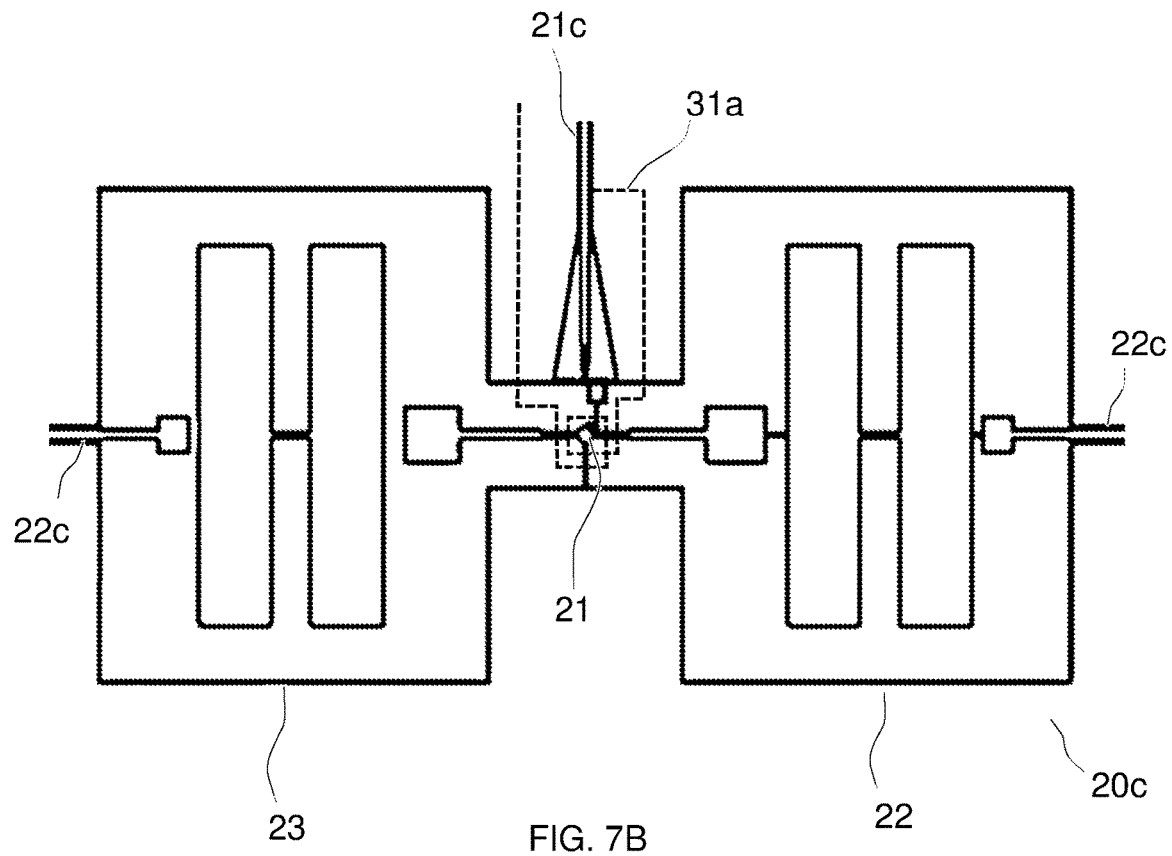

The accompanying drawings show simplified representations of devices or parts thereof, as involved in embodiments. Technical features depicted in the drawings are not necessarily to scale. In particular, the qubit and the tunable coupler layouts shown in FIGS. 7A and 7B are not to scale. Similar or functionally similar elements in the figures have been allocated the same numeral references, unless otherwise indicated.

DETAILED DESCRIPTION

The present invention relates in general to quantum processing apparatuses and methods of operation of such apparatuses. In particular, it is directed to a method of operating a quantum processing apparatus, where a compensation current signal is applied to a shielding circuit to magnetically shield a given component of a qubit chip from the stray magnetic field generated by a neighboring component on the qubit chip.

Embodiments of the present invention recognize that qubits are very sensitive to external magnetic fields. This is particularly true for superconductive qubits, notably where a direct current (DC) magnetic field is used to tune the frequency of individual computational qubits and/or an alternating current (AC) field is used to modulate a tunable coupler. Embodiments of the present invention further recognize that stray magnetic fields and crosstalk from neighboring qubits or transmission lines can also influence the qubits, which is undesirable. Typically, with higher integration, the numbers are expected to move to the lower boundary.

Magnetic shielding solutions have been developed for quantum computers. Such solutions rely on static magnetic shielding or active shielding of external stray fields. i.e., such solutions aim at protecting the whole quantum processing setup.

Embodiments of the present invention use active magnetic shielding to minimize magnetic fields outside the area where it is needed or to locally minimize magnetic fields for neighboring Qubits. Embodiments of the present invention recognize flux tunability is an advantage to build dynamic couplers. Such couplers can be used between charge or flux qubits to enhance gate speed. Embodiments of the present invention recognize flux tunable elements create a magnetic stray field interacting with other and or neighboring squids. Meaning, flux tunable elements will be attractive if stray fields can be controlled. Embodiments of the present invention generate a significant localized reduction of stray magnetic field.

Embodiments of the present invention improve upon the foregoing mentioned deficiencies by applying stray field scales linearly with the current applied to the intended magnetic field. As a result, no feedback loop is needed, and a scaled compensation current is used to minimize the undesired stray field. Embodiments of the present invention further improve upon the foregoing mentioned deficiencies by simplifying compensation. Embodiments of the present invention have all qubits and coils in one plane, resulting in the fields on the chip surface to all be in the z-direction. Embodiments of the present invention are integrated on a chip without requiring additional materials. Embodiments of the present invention use local crosstalk compensation to result in less frequency crowding effects. Embodiments of the present invention further use local shielding of the stray field such as a neighboring qubit. Embodiments of the present invention use frequency selective shielding. Embodiments of the present invention use signals which generate a known magnetic field of the aggressor. In these embodiments of the present invention, the current or the geometry for the compensation coil to shield the victim can be derived and no sensor or control loop is required. Embodiments of the present invention magnetic fields scale currents linearly, resulting in compensation current that is proportional to aggressor current. Embodiments of the present invention the fine grain resolution allows the compensation of effects at small dimensions, such as microns.

Embodiments of the present invention include a combination of one or more of local magnetic shielding, magnetic shielding outside of a coil, scaled current for field canceling, and identical current, field cancelling with geometric scaling.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 1:
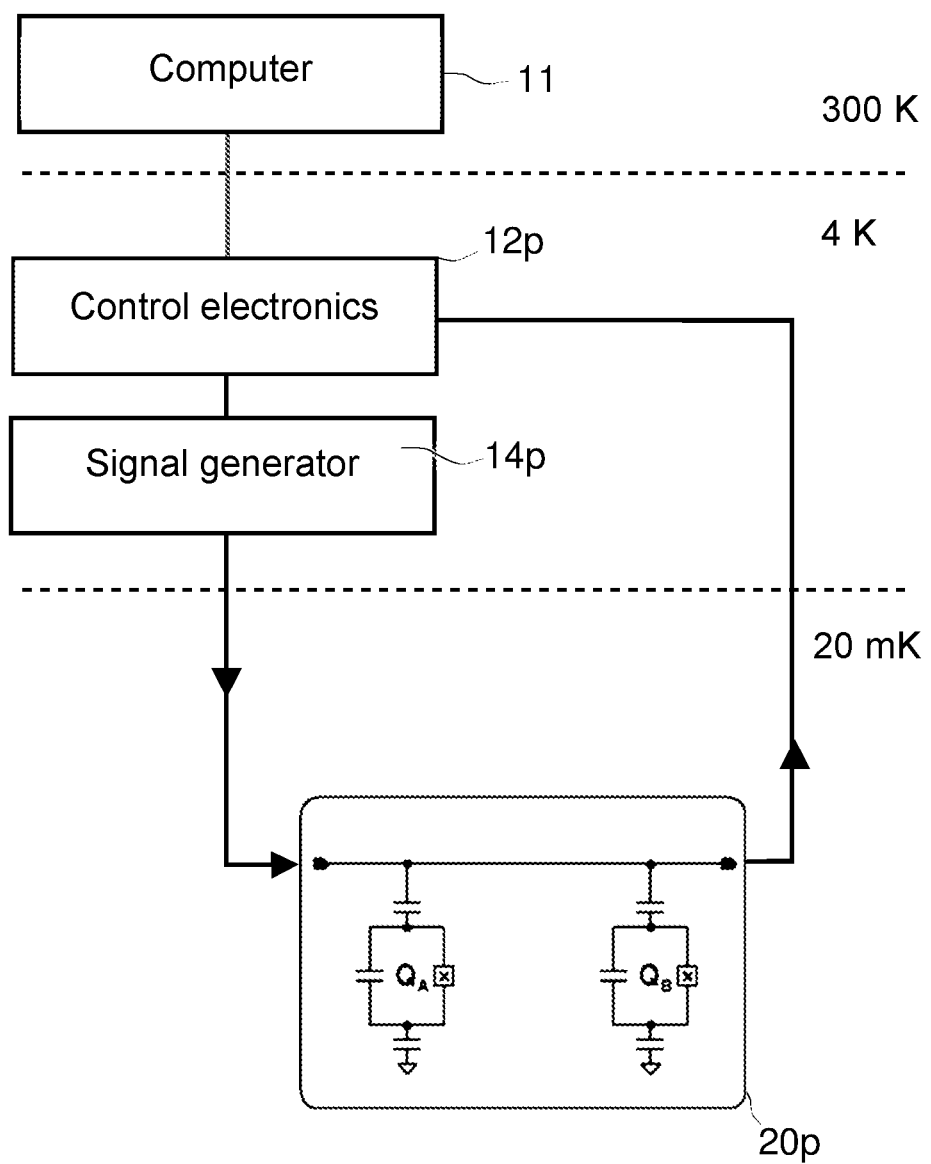
FIG. 1 is a diagram showing selected components of quantum processing apparatus in accordance with at least one embodiment of the present invention.
Figure 2:
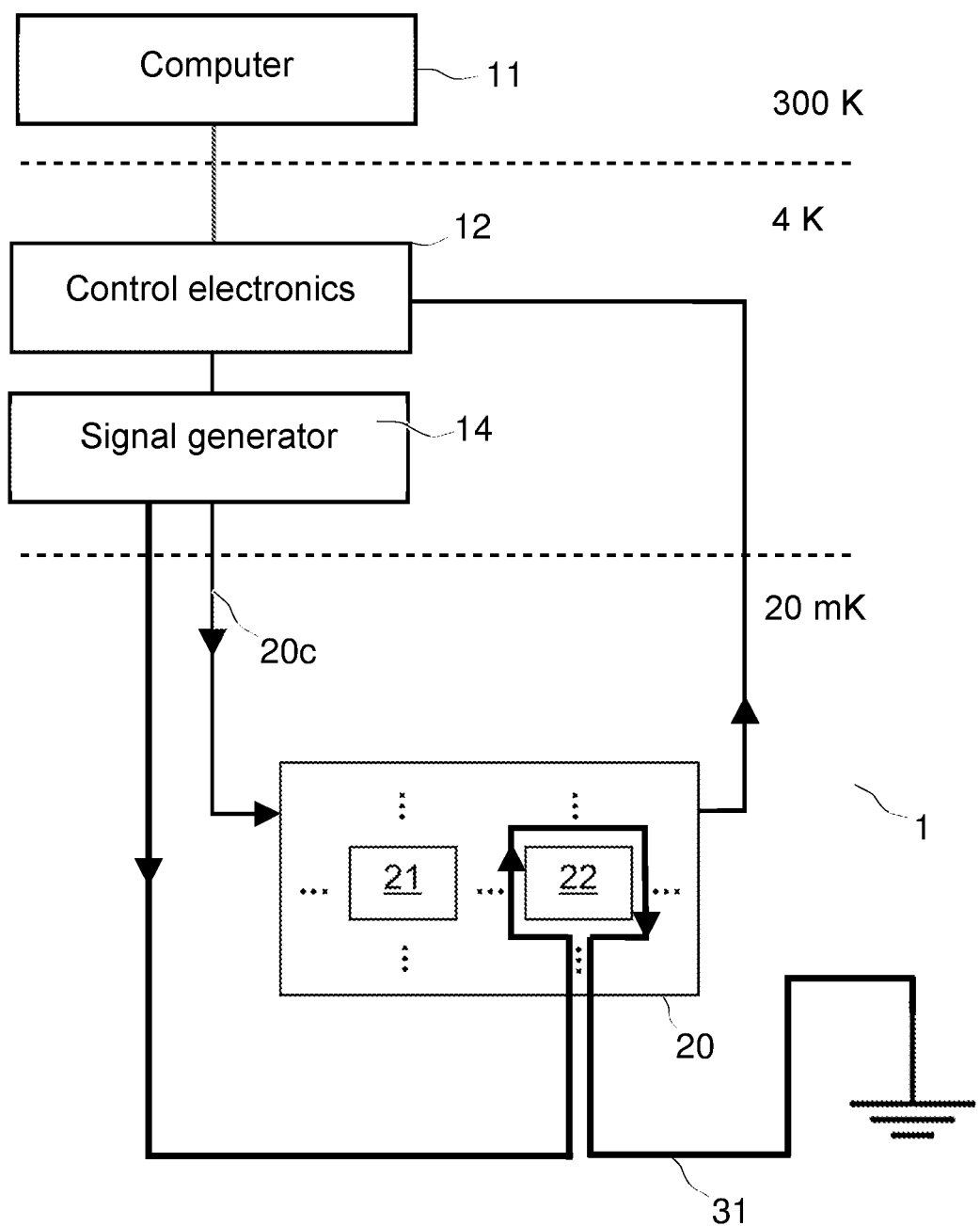
FIG. 2 is a diagram illustrating selected components of quantum processing apparatus in accordance with at least one embodiment of the present invention.
Figure 6:
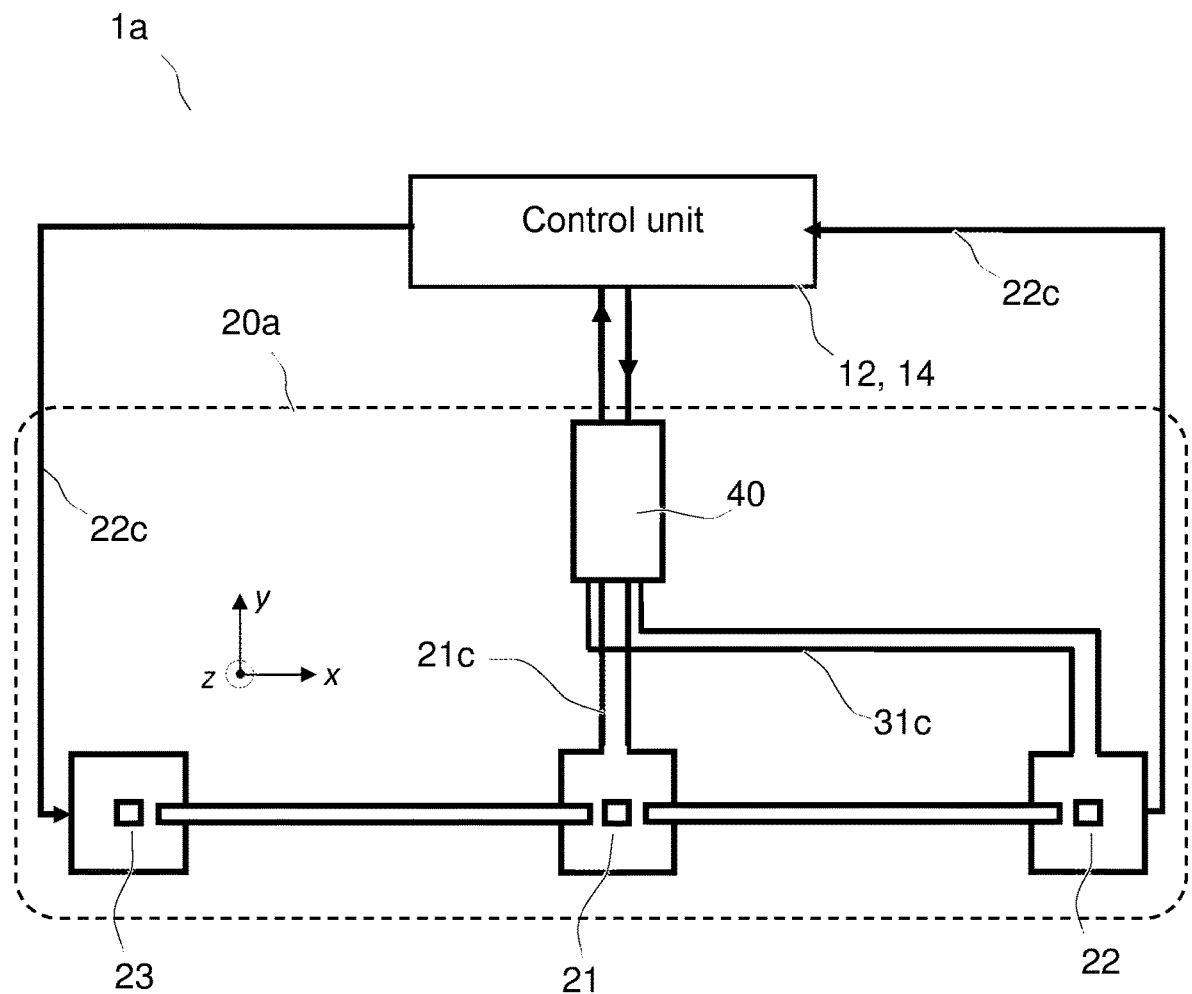
FIG. 6 is a diagram illustrating selected components of quantum processing apparatus in accordance with at least one embodiment of the present invention, in which the control unit is connected to both the shielding circuit and a field-emitting component via a coupler (a capacitive voltage divider or a transmission line coupler).

The following description is structured as follows. First, general embodiments and high-level variants are described in section 1. Section 2 addresses more specific embodiments and technical implementation details, and includes a detailed description of the accompanying drawings. Note, the present method and its variants are collectively referred to as the "present methods". Similarly, the present apparatus and its variants are collectively referred to as the "present apparatuses". All references Sn (e.g., S5, S10, etc.) refer to methods steps of the flowchart of FIG. 8, while numeral references pertain to physical parts or components of apparatuses such as shown in FIGS. 1, 2 and 6.

1. General Embodiments and High-Level Variants

In reference to FIGS. 2 to 7B, an aspect of the invention is first described, which concerns a method of operating a quantum processing apparatus, such as quantum processing apparatuses 1 and 1a, which may be a quantum computer or a quantum sensing apparatus. The following describes essential features of this method.

The quantum processing apparatuses 1 and 1a are assumed to include a qubit unit, e.g., a qubit chip. A qubit unit is generally denoted by the numeral reference 20 in the accompanying drawings. The references 20p, 20, 20a, 20b, and 20c, as seen in FIGS. 1, 2, 6, 7A, and 7B, denote possible variants of such a qubit unit. The qubit unit notably includes two components 21, 22, i.e., a first component 21 and a second component 22. For example, the first component 21 may be a tunable coupler, while the second component 22 may be a computational qubit. In an embodiment, tunable couplers are used to apply gate sequences. Additional examples are discussed later in detail, in reference to another aspect of the invention.

In addition, the qubit unit 20 includes a shielding circuit 31-33s, or at least a portion of such a shielding circuit. The shielding circuit may, for instance, include one or more loops (i.e., spire, or coils), which surround one or both of components 21, 22, at least partly. Such loops may also be referred to as "compensation loops" herein. The compensation loops are generally denoted by the numeral reference 31 in the accompanying drawings. The references 31, 31p, 31s, 31c, 31v, and 31a, as seen in FIGS. 2 to 7B, denote possible variants of the configuration of such compensation loops. The shielding circuit may possibly include a shaping circuit, where the latter includes additional loops meant to shape the stray field, as discussed later in reference to FIGS. 5A-5D.

In the examples of FIGS. 2 and 6, the shielding circuit 31, 31c includes a compensation loop that partly surrounds the second component 22, in a plane (x, y) of the qubit chip 20, 20a. Additional examples are discussed later in detail, in which the shielding circuit includes a compensation loop that surrounds the first component 21, instead of the second component 22.

The method comprises applying a first current signal to the first component 21. In addition, a second signal (current or voltage) may typically be applied to the second component 22, as assumed in the following. The applied signals aim at operating the two components 21, 22 (see steps S10 and S20 in the flow of FIG. 8), as usual in quantum processing. In practice, such signals are repeatedly applied, e.g., to drive the coupler and/or the qubits.

In an embodiment, the first component 21 is assumed to generate a stray magnetic field as a result of the first signal(s) applied. The stray magnetic field that results is further assumed to impact the operation of the second component 22, in operation of the quantum processing apparatus, such as quantum computing apparatuses 1 and 1a. For this reason, the first component 21 is sometimes referred to as the "aggressor", while the second component 22 is sometimes referred to as a "victim" herein.

To address this issue, the present method further includes applying (at step S30) a compensation current signal to the shielding circuit 31-33s, to magnetically shield the second component 22 from the stray magnetic field generated by the first component 21. Note, the signals applied at steps S10 and S20 may be applied concomitantly, or not, depending on the desired operation of the components 21, 22. However, steps S10 and S30 are normally performed concomitantly, in order to achieve the desired shielding effect. The compensation current signal applied at step S30 may possibly be obtained as a result of applying the first signal (step S10), owing to preferred configurations of the shielding circuit, as described later in detail, in reference to another aspect of the invention. In that case, steps S10 and S30 are not only concomitant but also synchronous.

The compensation current signal applied at step S30 is a signal generated according to a predetermined function of the first signal. The predetermined function is fixed, owing to the configuration of the shielding circuit and the way the compensation signal is generated by the signal generator 14. This predetermined function is at least partly enabled by the shielding circuit 31-33s. The predetermined function can also be regarded as a binary relation (in a mathematical sense). However, the predetermined function is a manifestation of the shielding circuit and, if necessary, other components of the apparatus. In other words, the shielding circuit and other components of the apparatus (as needed to generate the compensation signal) are jointly configured to ensure a certain correspondence between the first current signal and the compensation current signal.

The first signal is typically generated by a signal generator 14 of the control unit 12, 14, and applied to the first component 21 via a first circuit. The shielding circuit may possibly be independent from this first circuit, as assumed in FIG. 2, where the shielding circuit 31 is independent of the circuit 20c connecting to the qubit unit 20. In variants, however, the shielding circuit is connected to the first circuit 21c, in parallel or in series, as illustrated in FIGS. 4 to 7. In all cases, the proposed configurations of the shielding circuit result in very simple circuit layouts. In addition, connecting the shielding circuit to the first circuit, e.g., directly in the qubit unit, allows the numbers of connectors and wires needed from the signal generator 14 to be reduced, e.g., to save footprint on a qubit chip.

Owing to the predetermined function enabled by the shielding circuit, the compensation signal applied makes it possible to locally shield stray magnetic fields and thereby protect the second component, without requiring any sensor and feedback loop, as required in prior, active solutions. Note, although the above method is described in reference to a single pair of components (the aggressor and the victim), it will be apparent to the skilled person in the art that the method can be applied (simultaneously or not) to multiple aggressor-victim pairs.

Since the first current signal that generates the stray magnetic field is known by the control unit 12, 14, the compensation current applied to the shielding circuit and/or the geometry of the shielding circuit (including, e.g., a compensation loop) can be optimized to reduce or cancel the residual magnetic field at the level of the second component (the victim), without requiring any sensor or control loop. Indeed, magnetic field intensities scale linearly with currents; thus, the compensation current can be set proportional to or equal to the first current to achieve the desired shielding effect. Moreover, as stated earlier, the shielding circuit typically includes one or more loops, the geometry of which can be optimized to reduce or cancel the stray field at the level of the victim 22. Also, the resolution that can be achieved (sub-micron level) for the loops allow the stray fields to be compensated at a small scale (e.g., a few microns).

Methods for operating quantum processing apparatuses typically rely on: (i) static magnetic shielding; or (ii) active shielding of external stray fields for the whole quantum apparatus, using Helmholtz coils and a field sensor close to the qubit unit. On the contrary, the present solution is local, i.e., it acts locally, near the victim components. It is not a static solution, insofar as the compensation signal that is locally applied depends on the signal applied to the aggressor 21. It is not an active solution either, inasmuch as it does not require sensors and feedback loops. Rather, embodiments of the present invention can be regarded as a semi-active solution, aiming at locally shielding stray magnetic fields occurring due to neighboring components 21 (e.g., computational qubits or tunable couplers), to protect a victim component 22 (e.g., a computational qubit).

Note, the proposed approach primarily aims at shielding stray fields generated at the level of the qubit unit 20 (e.g., on the qubit chip), rather than stray fields generated outside the qubit unit. However, the shielding circuit may potentially be designed to further compensate for fixed stray fields generated outside the qubit unit 20, if necessary.

Embodiments of the present invention can be integrated with a qubit chip, without requiring additional (e.g., non-compatible) materials, and without requiring substantial changes to the fabrication methods used to fabricate the qubit chip. A compensation circuit is needed (compare FIGS. 1 and 2), which is preferably realized using the same processing technology as used to obtain the qubit unit 20p of FIG. 1. That is, the same types of conductors (or superconductors) as used for the rest of the qubit unit (e.g., a qubit chip) may be relied on to obtain the shielding circuit 31-33s. In particular, the shielding circuit may be fabricated using the same lithographic masks as used to fabricate the other conductors and structures needed on the qubit chip. Typical dimensions of such conductors are on the scale of micrometers, with sub-micrometer resolution.

Interestingly, the present approach can also be used to achieve local crosstalk compensation, which results in a reduction in frequency crowding effects at the level of the victim, i.e., the second component 22. Still, the proposed solution does not operate on the frequencies of the victim component.

Additional features of the present methods are implicitly addressed, in the rest of the description, which concerns another aspect of the invention, i.e., a quantum processing apparatus 1, 1a. This apparatus is now described in detail in reference to FIGS. 2-6.

As previously described, the apparatus includes a qubit unit 20 with a shielding circuit 31-33s and two components 21, 22, i.e., a first component 21 (the aggressor) and a second component 22 (the victim). The apparatus further includes a control unit 12, 14, which is operatively connected to each of the first component 21 and the shielding circuit 31-33s, so as to be able to apply S10, S30 current signals, consistently with the present methods. The control unit may further be connected to the second component 22, if necessary, to be able to apply signals to this component and operate it, as assumed in the following.

In operation, a first current signal and a second signal (current or voltage) are applied to the first component 21 and the second component 22, respectively, to operate the two components 21, 22. This causes the first component 21 to generate a stray magnetic field impacting the operation of the second component 22, in operation of the apparatus. To cope with this issue, the apparatus is further configured to apply a compensation current signal to the shielding circuit 31-33s, so as to magnetically shield the second component 22 from the stray magnetic field generated by the first component 21. Again, the compensation current signal is generated according to a predetermined function of the first signal, where this function is a manifestation of the shielding circuit and, possibly other components (such as components of the control unit 12, 14) of the apparatus, as discussed earlier.

The control unit 12, 14 may notably include a controller 12 and one or more signal generators 14. The controller 12 is connected to the signal generator(s) 14, where the latter is(are) connected, on the one hand, to the shielding circuit, and, on the other hand, to the components 21, 22 of the qubit unit via respective circuits. In the example of FIG. 2, a single signal generator 14 is used, which is connected to the shielding circuit 31 and the components 21, 22 (via the circuit 20c).

Apparatuses of the present invention are generally described with reference to two components 21, 22 only, i.e., an aggressor and a victim, for the sake of conciseness. However, the qubit unit 20 may include 10s or 100s of components, or more, and the present principle may possibly be applied to any number of potential aggressors and victims in the qubit unit. In an embodiment, the shielding circuit may be configured to shield several components, or several shielding circuits may be provided to achieve the same.

Each of the two components 21, 22 may for example be a fixed frequency superconducting qubit (e.g., of the transmon type), a tunable coupler (to couple the fixed frequency transmon qubits), or, in fact, a mere Josephson junction.

In an embodiment, the potential victims are fixed frequency quantum circuits 22, 23, i.e., circuits configured as computational qubits in the apparatus. The quantum circuits 22, 23 may, each, further be coupled to a tunable coupler 21. The frequency of the tunable coupler 21 can be modulated, in order to, e.g., drive selectively addressable energy transitions in the quantum processing apparatus. The tunable coupling elements may for instance be embodied as frequency-tunable, superconducting qubits, i.e., involving SQUID loops. Each of the quantum circuits 22, 23 is typically a non-linear quantum circuit, which can be used as a computational qubit. By "non-linear", it is meant that at least two distinct energy levels (i.e., of different energies) of the quantum circuits can be addressed. However, the fixed frequency quantum circuits can also be harmonic oscillators, in variants. The tunable couplers 21, which act as frequency-tunable coupling elements, may also generate undesired stray fields, hence the benefits of the proposed solution.

It should be noted that a "superconducting" element is an element that may potentially become superconducting under certain conditions. Thus, components mentioned herein as superconducting components (e.g., superconducting qubits, channels, circuits, etc.) are components that include one or more potentially superconducting materials. I.e., such materials may for example comprise aluminum (Al) or titanium nitride (TiN), which can become superconducting under certain conditions of temperatures and magnetic fields. Accordingly, when the qubit unit is a superconducting unit (e.g., a chip including superconductors), the qubit unit may include at least a portion of a first circuit (e.g., circuit 21c) connecting to the aggressor 21, a second circuit (e.g., circuit 22c) connecting to a victim, and the shielding circuit 31-33s, where such circuit portions can potentially become superconducting.

Beyond transmons, however, other types of superconducting qubits may possibly benefit from the present approach, including Xmon and gatemon qubits. In addition to superconducting qubit units, it will be apparent to the one skilled in the art that the present approach may advantageously be applied to other solid-state qubit architectures, including spin-based quantum circuits (or spin qubits for short) and topological qubits.

As illustrated in FIGS. 4-7, the first current signal is typically applied S10 to the first component 21 via a first circuit 21c. A terminal portion of this circuit 21c may actually be considered to form part of the first component 21, as is the case in FIGS. 6, 7A, and 7B, where the terminal portion of a flux line 21c can be regarded as forming part of a tunable coupler 21. In an embodiment, the central loop 21c seen in FIGS. 5A-5D forms part of a tunable coupler or a Josephson junction.

In an embodiment, the shielding circuit 31-33s connects to the first circuit 21c, to allow the apparatus to enable and implement the predetermined function described earlier. For example, the shielding circuit may include a loop connected in series with a circuit portion 21c, see, e.g., the loops 31s in FIGS. 5C and 5D. In variants, the shielding circuit may include a loop connected in parallel with a circuit portion 21c, see, e.g., the loops 31p, 31c, 31v, and 31a in FIGS. 4, 5A, 5B, 6, 7A, and 7B. A parallel connection results in identical currents being applied in the circuit portion 21c and in the compensation loops 31p, 31c, 31v, 31a for superconducting circuits. A series connection ensure identical currents, irrespective of the respective resistances of the two circuits.

More generally, several configurations can be contemplated for the shielding circuit, which result in the compensation current signal applied S30 having the same amplitude as the first current signal applied S10. In variants, the shielding circuit may be designed to ensure that compensation current signal applied S30 has an amplitude that is scaled with respect to the amplitude of the first current signal applied S10. This may notably be achieved with an arrangement such as shown in FIG. 2, where the shielding circuit is independent from the circuit 20c connecting the qubit unit 20 to the control unit 12, 14. In both cases, the shielding circuit may be configured so as to further ensure that the compensation current signal and the first current signal have synchronized frequency and phase, to ensure a cancellation of the stray fields.

Besides the first circuit connecting to the first component 21, the quantum processing apparatus 1, 1a may include one or more second circuits 22c, connecting components 22, 23 of the qubit unit 20, 20a, as depicted in FIGS. 6, 7A, and 7B. In the context of superconducting qubit chips, the circuits 21c and 22c include channels, which are possibly configured as couplers/resonators. Like the circuit 20c in FIG. 2, the circuits 21c, 22c are used to apply the first and second signals to the first components 21 and the second components 22, 23, in operation. Distinct signals are typically applied to the second components 22, 23, e.g., qubits. The signals applied to the qubits via the circuit 20c, 22c may typically give rise to signals transmitted along transmission lines coupling one qubit 23 to another 22 via a tunable coupler 21, as in the examples of FIGS. 6 and 7.

For example, in FIG. 6, the control unit 12, 14 is connected to the first component 21 via a first circuit 21c and is further connected to second component(s) 22, 23 via a second circuit 22c. The shielding circuit 31c and the first circuit 21c are connected, in parallel, to the control unit 12, 14, to enable the predetermined function. Since the first circuit 21c and the shielding circuit 31c are superconducting circuits in this example, the parallel connection ensures identical currents in each circuit path.

In an embodiment, the control unit 12, 14 includes a single signal generator 14, connecting to each of the shielding circuit 31c, the first circuit 21c, and the second circuit 22c. In an embodiment, the signal generator 14 is connected to each of the shielding circuit 31c and the first component 21 via a coupler 40, which may for example be a capacitive voltage divider or a transmission line coupler, to enable the predetermined function. Capacitive voltage dividers and transmission line couplers are known by one with ordinary skill in the art. However, the physics of the coupling mechanisms differ, notwithstanding the depiction used in FIG. 6.

Figure 4:
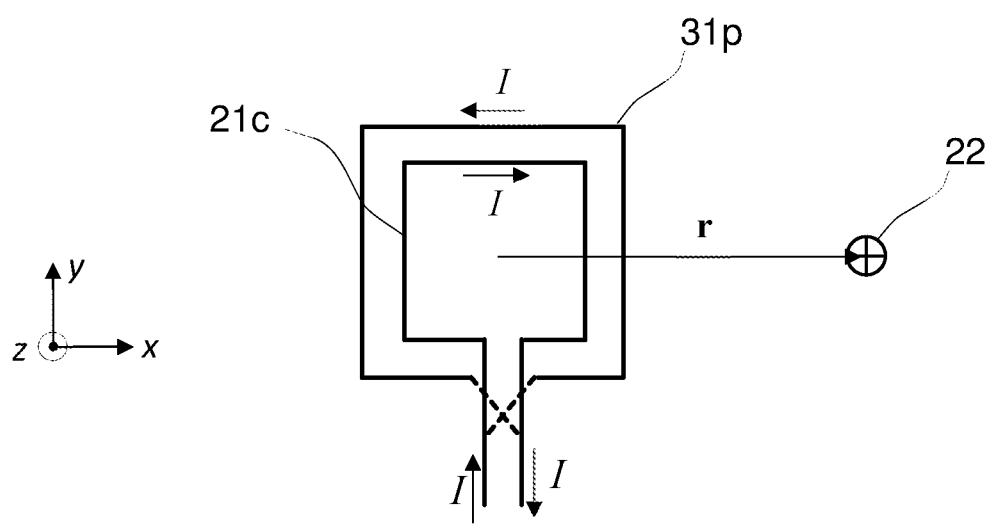
FIG. 4 schematically illustrates a compensation circuit loop surrounding a circuit portion about a first component (on the LHS) of a qubit unit, to shield a second component (on the RHS) from the stray magnetic field generated by the first component, in accordance with at least one embodiment of the present invention.
Figure 5A:
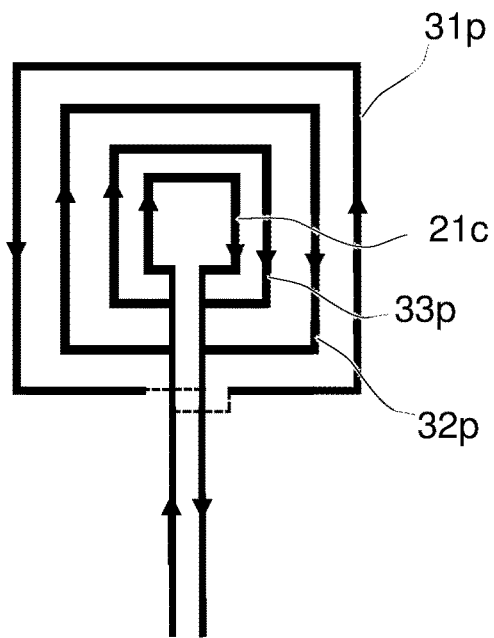
FIGS. 5A-5D illustrate various shielding circuit configurations in accordance with various embodiments of the present invention, wherein the shielding circuit includes both a compensation circuit and a shaping circuit. The compensation circuit includes a loop that surrounds additional loops of the shaping circuit, themselves surrounding a field-emitting component of the qubit chip, as in embodiments.
Figure 5B:
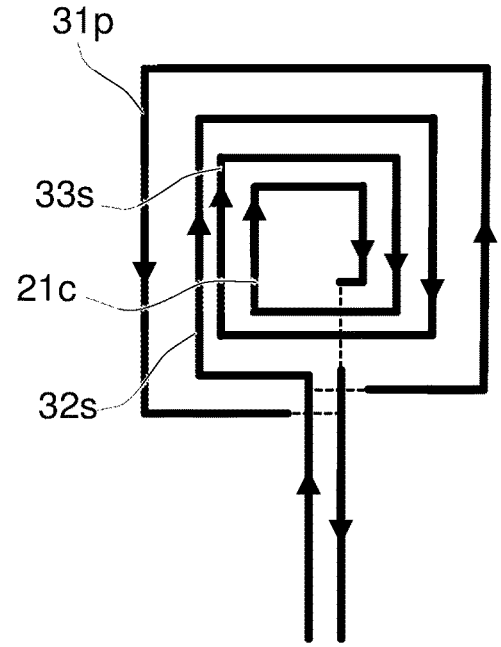

It should be appreciated that other parallel configurations can be contemplated, as illustrated in FIGS. 4, 5A, and 5B, where the shielding circuit essentially includes a loop 31p surrounding the first circuit 21c. In such examples, the loop 31p simply connects, in parallel, from the first circuit 21c or from conductors leading to the first circuit 21c.

Figure 5C:
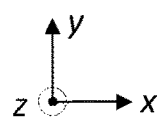
Figure 5C:
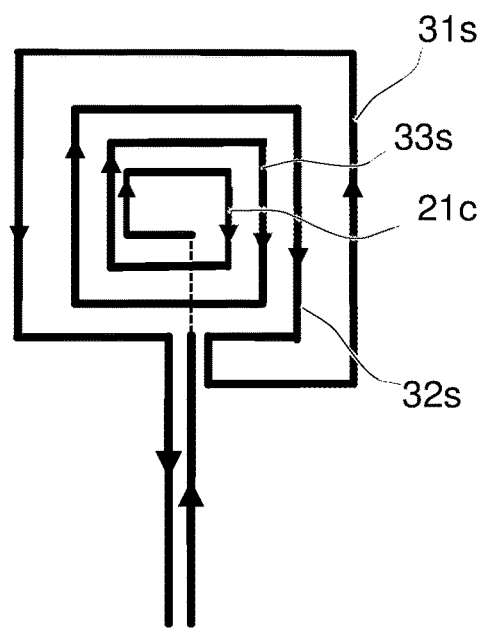
Figure 5D:
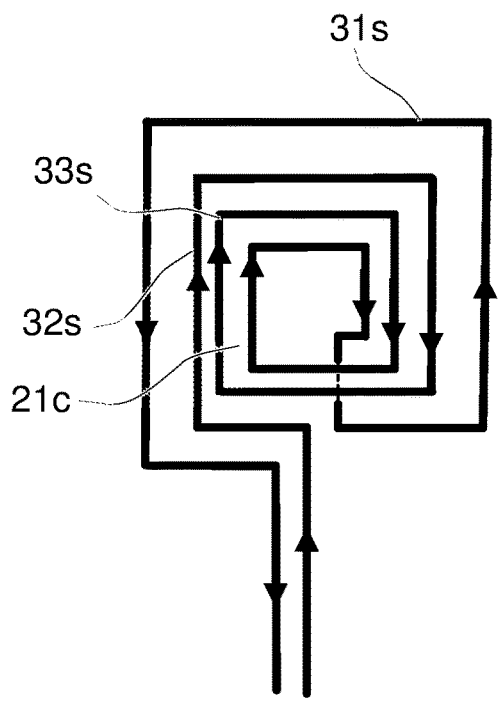

Besides parallel configurations, mere series configurations can be contemplated, as illustrated in FIGS. 5C and 5D, where a compensation loop 31s connects, in series, with conductors connecting to the first circuit 21c. Note, in the circuit layouts shown in FIGS. 4-5, the signal generator 14 is connected to the first circuit 21c, be it directly or indirectly, while loops of the shielding circuit 31-33s connect to the first circuit 21c (in parallel and/or in series), within the qubit unit (e.g., on the qubit chip).

In addition, in each of FIGS. 4-7, the first component 21 and the second component 22 are essentially arranged on a same plane (x, y) in the qubit unit 20, i.e., a main plane of the qubit chip. In each of FIGS. 4, 5, 6, and 7B, the shielding circuit includes an outer loop that surrounds the first component 21 (the aggressor), in the plane (x, y). In variants, some or all of the loops of the shielding circuit may be formed on another layer or another side of the chip, i.e., in a plane that is distinct from, yet parallel to, and close to the plane (x, y) on which the components 21, 22, 23 are arranged.

By contrast, in FIGS. 2, 3, and 7A, the loop(s) of the shielding circuit surround(s) the second component(s) 22, 23, i.e., the victim(s). The shielding circuit involves a single loop in FIGS. 2-6. More generally, the shielding circuit may involve one or more compensation loops, which surround, each, one or each of the component 21, 22, 23 in the plane (x, y), see, e.g., FIG. 7A, or a plane that is parallel but very close to the plane (x, y). Because of the circuit layout constraints, though, such loops may not entirely surround their respective components, as assumed in the accompanying drawings. And, as illustrated in FIG. 7A, the compensation circuit may also include several loops, which are coiled so as to surround each of two or more of the potential victims 22, 23.

In the examples of FIGS. 5A-5D, the shielding circuit 31-33s includes both a compensation circuit and a shaping circuit 32p-33s. The compensation circuit includes an outer loop 31p, 31s surrounding inner loops. The inner loops may notably include two or more additional loops 32p-33s of the shaping circuit, where each of the additional loops 32p-33s surrounds the first component 21 (including a loop 21c thereof) in the plane of the chip. In such examples, the additional loops are coiled around the aggressor 21 to shape the stray field emitted by the latter.

The loops 32p-33s of the shaping circuit are preferably arranged in the same plane as the compensation circuit loop(s) 31p, 31s. The resulting loops 31p, 31s, 32p, 32s, 33p, 33s may all be concentric, such that an outer compensation loop 31p, 31s surrounds the two or more additional loops 32p-33s in the plane of the chip. In an embodiment, the geometry of these loops is jointly optimized (e.g., by trial and error, using simulations, as done in FIGS. 3A and 3B), to minimize the stray field intensities at the location of the victim(s).

As further illustrated in FIG. 4, the current direction in the compensation loop 31p is typically opposite to the current direction in the inner loop 21c involved at the aggressor. Similarly, in FIGS. 5A-5D, the shielding circuit is designed so as for the current signal applied to circulate according to a same rotation direction in the shaping circuit loops, whereas the current flowing in the outer loop 31p, 31s has an opposite rotation direction. Further designs may be obtained, e.g., yielding alternate rotation directions for the current flows, to suitably sculpt the residual magnetic field intensities at the level of a victim. In embodiments, some loops may surround the aggressor to shape the magnetic field, while a compensation loop surrounds the victim (not shown).

In an embodiment, the compensation signal applied to the shielding circuit may be equal to the first current or be scaled (in amplitude) with respect to the first current. To that aim, the shielding circuit may be connected to the first circuit, in parallel or in series. Thus, each of the first current signal and the compensation current signal may possibly be applied as one and a same initial current signal. Yet, this initial signal eventually reaches distinct components 21, 22, 23, this notably giving rise to a first current (applied to the aggressor) and a compensation current (applied to the compensation loop).

The above embodiments have been succinctly described in reference to the accompanying drawings and may accommodate a number of variants. Several combinations of the above features may be contemplated. Examples are given in the next section.

2. Specific Embodiments, Technical Implementation Details, and Detailed Description of the Drawings

2.1 Description of Preferred Quantum Circuits

Preferably, the quantum circuits 22, 23 (i.e., the potential "victim" qubits) are embodied as superconducting quantum circuits, forming the basis computational elements. The present apparatus 1, 1a is typically designed to operate in the radiofrequency spectrum and typically requires to be cooled down to temperatures below 100 mK, using dilution refrigerators. Notwithstanding, components of the apparatus can be addressed with conventional electronics. In an embodiment, the quantum processing apparatus 1, 1a includes a number of solid-state qubits, typically in the range of 50 to 400 qubits. In an embodiment, the quantum apparatus may include a smaller or larger number of qubits, especially as several physical redundancy qubits are needed to form a logical, error corrected, qubit.

In particular, the present quantum circuits are preferably realized as fixed frequency, transmon-type quantum circuits, i.e., as single-Josephson junction superconducting qubits. This way, the processing apparatuses can take advantage of long coherence times of the fixed frequency transmons. In an embodiment, qubits 22, 23 are coupled via tunable couplers 21 and are potentially victims of residual stray field from the couplers 21. In an embodiment, each coupler 21 may be realized as a transmon, although the latter will not form part of the basis computational elements.

In an embodiment, the tunable coupler 21 is capacitively coupled to one or more quantum circuits 22, 23. For example, and as illustrated in FIG. 6, the chip 20a may involve two fixed frequency, single-Josephson junction superconducting qubits 22, 23 and a tunable coupler 21. In this example, the tunable coupler 21 is laid out as a non-harmonic oscillator circuit, as a qubit of the transmon type. Yet, the coupler 21 is given an extra degree freedom, by way of an additional Josephson junction (not shown), which forms a superconducting quantum interference device (SQUID) loop, as known by one of ordinary skill in the art. In turn, the SQUID loop can be used to tune the coupler's frequency. A similar chip architecture is assumed in FIGS. 7A and 7B.

Superconducting quantum circuits of the transmon type are controlled by radio frequency (RF) technology and operated at temperatures of a few mK only. The RF signals are typically fed into the cryostat with coax cables. Two channels normally suffice to control the qubits. Attenuators (not shown) are typically placed on intermediate temperature platforms to thermalize the signals on each of the upward and downward path. In variants, the qubits are configured as spin-based quantum circuits, or spin qubits for short. In other variants, the qubits are topological qubits. In all cases, the platform on which the qubits are arranged is typically meant to be operated at very low temperatures.

2.2 Detailed Description of the Drawings 2.2.1 FIG. 1

FIG. 1 is, as such, not according to the invention. However, FIG. 1 shows components of a quantum processing apparatus that may typically be involved in embodiments. Indeed, in embodiments, and as also shown in FIG. 1, the quantum processing apparatus may comprise three platforms (at least). These include a first platform, on which the qubits are arranged. The first platform contains one or more qubit chips 20p; it is designed to be cooled down at a very low temperature $T_1$ (e.g., 20 mK). A second platform is provided, which is designed to be cooled down at a second temperature $T_2$ that is larger than $T_1$. The temperature $T_2$ is typically between 2 and 6 K, e.g., 3 or 4 K. A third platform is operated at a third temperature $T_3$ (e.g., at room temperature, 300 K), which is larger than $T_2$.

A signal generator 14p (generating the needed current and/or voltage signals) is connected to control electronics 12p (notably performing the sequencing), itself connected to a computer 11 to interface the quantum processing apparatus with the external world.

2.2.2 FIG. 2

FIG. 2 shows only three platforms, for simplicity. However, one or more intermediate platforms may further be provided, as usual in the art. For example, the first platform may be operated at 20 mK, the second at 3 K, and a further intermediate platform, e.g., operated at 50 K, may be provided below the room-temperature platform.

FIG. 2 shows an arrangement essentially similar to that of FIG. 1, except that FIG. 2 further involves a shielding circuit 31, connected to the generator 14, where the shielding circuit 31 includes a compensation loop that partly surrounds a component 22 of the qubit chip 20, to magnetically shield the component 22 from the stray field generated by a neighboring component 21. Signals meant to be applied to the components 21, 22 are first sequenced at the level of the control electronics 12 and corresponding signals are generated by the signal generator 14 and passed to the qubit chip 20 via a circuit 20c. In an embodiment, the compensation signal applied to the compensation loop 31 is scaled with respect to the current applied to the component 21 in this example.

2.2.3 FIG. 3

Figure 3A:
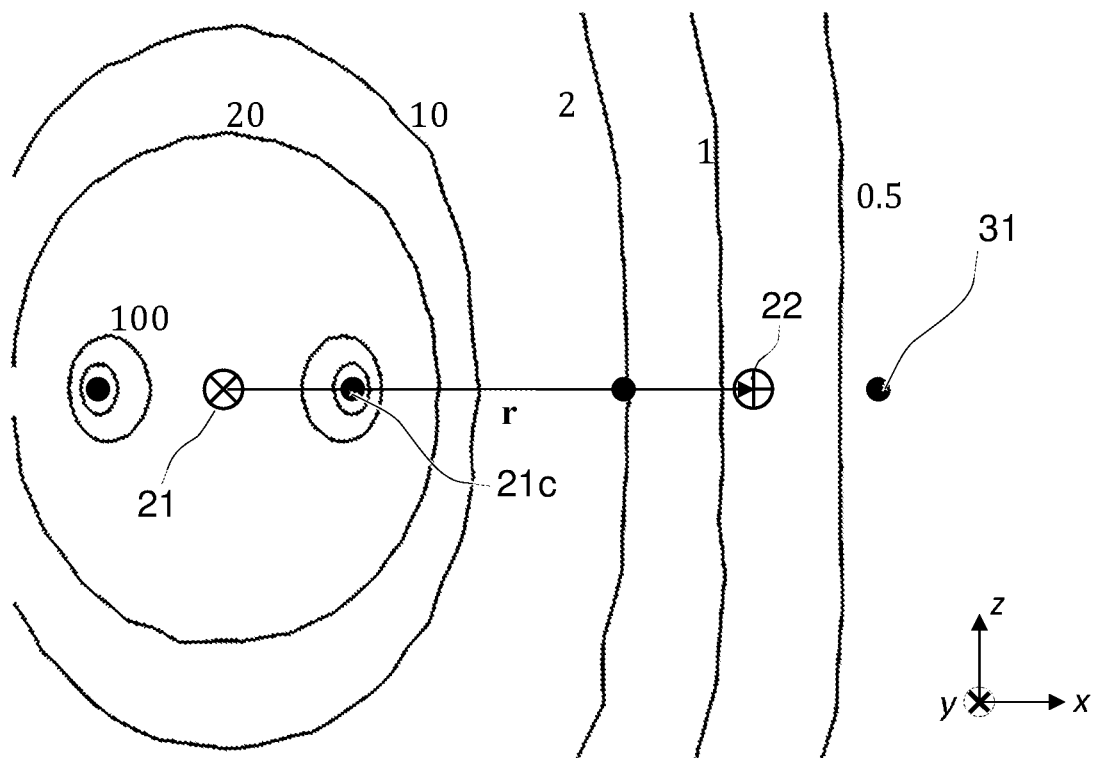
FIGS. 3A and 3B are contour plots obtained by simulating a qubit chip including two neighboring components in a configuration similar to that shown in FIG. 2, in accordance with at least one embodiment of the present invention. The plots depict contour lines of the intensity of the stray magnetic field generated by the left-hand side (LHS) component in a plane that is perpendicular to the main plane of the qubit chip.
Figure 3B:
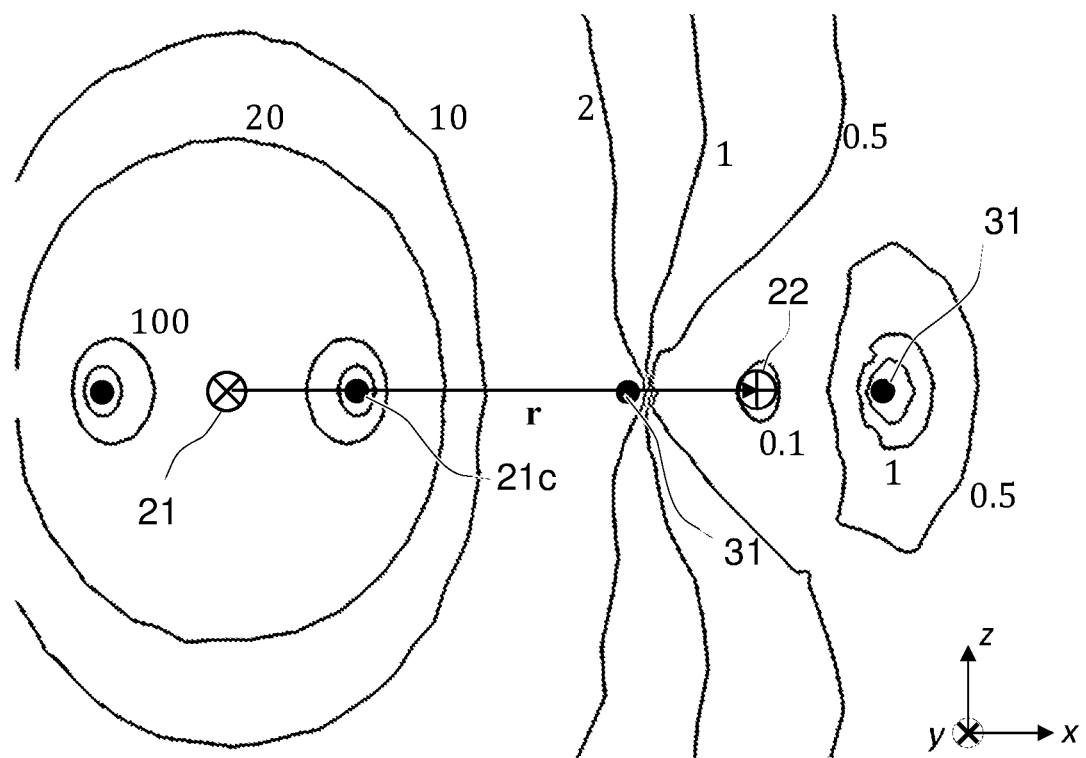

FIGS. 3A and 3B show contour plots obtained by simulation, in absence of compensation (FIG. 3A) or using a semi-active compensation (FIG. 3B), in a configuration similar to that of FIG. 2. That is, the compensation coil 31 surrounds the victim 22, centered on the point mapped by vector r, i.e., at a distance r=|r| of the aggressor 21.

FIGS. 3A and 3B show selected contour lines of the total magnetic field intensity in the plane (x, z), corresponding to a main plane of the qubit chip on which the components 21, 22 are arranged. The contour values are 0.1, 0.5, 1, 2, 10, 20, 100, 200. All the contour values (but the value 200) are indicated in the vicinity of their respective contours. The figures illustrate how the stray field generated by the aggressor 21 can be locally shielded at the level of the victim 22 by applying a compensation current signal to the loop 31 of the shielding circuit that surrounds the victim 22.

It should be noted that the plots are not perfectly symmetric with respect to the horizontal plane (in y=0), due to differences between the materials' compositions on each side of the interface. The material below the plane y=0 is assumed to be silicon in this example; it is exposed to air, hence the slight asymmetry observed. The permeability is roughly the same for silicon and air, but the permittivity is approximately 10 times lower for air (11.9 vs. 1.0). The silicon material is assumed to be lossless, with no free carriers.

The diameters of the coils is assumed to be equal to 120 microns, the distance between the two centers of the components 21, 22 is 250 microns, the width of the wire forming the coils is 2 microns, its height is 1 micron. The aggressor current is of 10 mA, while the compensation current is of 0.111 mA. The magnetic (H) field intensity is of 0.82 A/m at the level of the second component 22 without applying a compensation current (FIG. 3A). Note, the compensation coil somewhat lowers the stray field already. The magnetic (H) field intensity reduces to 0.015 A/m when applying the compensation current (FIG. 3B).

2.2.4 FIG. 4

FIG. 4 shows how an outer compensation loop 31p can be connected in parallel with the inner circuit 21c that forms part of an aggressor 21, located at the origin. The victim 22 is again centered on r, i.e., at a distance r=|r| of the aggressor 21. The compensation coil 31p surrounds the coil 21c. The dashed lines denote conductors (comprising, e.g., though vias) used to ensure the parallel connections, i.e., circuit portions realized out-of-plane to ensure safe connections, free of shorts. Using only a single outer compensation loop 31p (without any shaping loops), centered on the aggressor 21, will typically result in overcompensating the stray field at the level of the victim 22.

Thus, preferred is to use additional loops of a shaping circuit, as seen in FIGS. 5A-5D, or to place the compensation loop at the level of the victim, as shown in FIG. 2.

2.2.5 FIGS. 5A-5D

FIGS. 5A-5D also show outer compensation loops 31p, 31s that surround an inner coil 21c as well as two additional coils 32p, 33p; 32s, 33s. The victim is not shown. In FIGS. 5A, 5B, the outer loop 31p is connected in parallel with the inner coils 21c. In FIG. 5A, the shaping coils 32p, 33p are connected, each, in parallel with the inner coil 21c too, whereas the coils 32s, 33s are connected in series with the inner coil 21c in FIG. 5B. In FIGS. 5C and 5D, all coils are connected in series, owing to distinct circuit design. Again, the dashed lines depict circuit portions realized out-of-plane to ensure short-free connections.

2.2.6 FIG. 6

In the example of FIG. 6, the components 21-23 of quantum computing apparatus 1a are connected to the control unit 12, 14, as explained in section 1. The aggressor 21 is connected to the control unit via a first circuit 21c and a shielding circuit 31c connects from the circuit 21c, via a coupler 40. The qubit unit 20a is assumed to be a superconducting qubit unit, which includes two superconducting computational qubit (transmons) 22, 23. The first component 21 is a tunable coupler; the first circuit 21c is a flux line in this case. The transmons 22, 23 are connected to the coupler via a transmission line. The first current signal is applied via the circuit 21c so as to drive the coupler 21, while additional current signals are applied via a second circuit 22c to drive the transmons 22, 23.

In an embodiment, another shielding circuit (not shown) may typically be used to protect the second qubit 23.

2.2.7 FIGS. 7A and 7B

FIGS. 7A and 7B depict superconducting qubit chip layouts 20b, 20c, in which two transmon-type, computational qubits 22, 23 are coupled via a tunable coupler 21, such that the computational qubits 22, 23 may undergo stray magnetic fields emitted by the tunable coupler 21, in operation. The qubits 22, 23 are connected to a circuit 22c. Transmission lines connect each qubit 22, 23 to the tunable coupler 21.

More precisely, the qubits are fixed-frequency transmons 22, 23, which are capacitively coupled to a flux-tunable transmon acting as a tunable coupler 21, similar to FIG. 6. The tunable coupler 21 is controlled by a flux line 21c providing a current I(t) and a consequent flux $\Phi(t)$ threading the superconducting quantum-interference device (SQUID) loop of the coupler 21. Each of the fixed-frequency qubits 22, 23 is coupled to an individual readout resonator R1, R2.

FIG. 7A further shows a shielding circuit (dashed line) 31v coiled around each of the computational qubits. The shielding circuit branches from the flux line 21c, in parallel.

FIG. 7B shows a shielding circuit (dashed line) 31a coiled around the sole tunable coupler 21. In both cases, the shielding circuit shields the computational qubits from the stray magnetic field generated by the tunable coupler, according to embodiments.

2.2.8 FIG. 8

Figure 8:
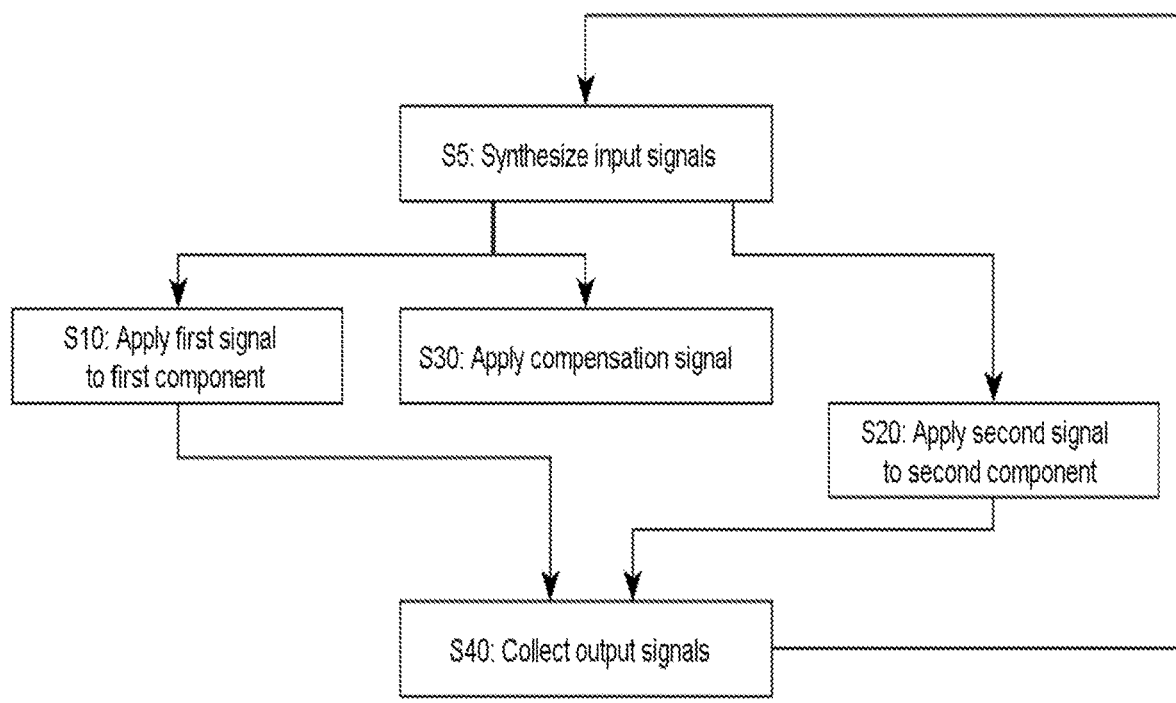
FIG. 8 is a flowchart illustrating high-level steps of a method of operating a quantum processing apparatus in accordance with at least one embodiment of the present invention.

FIG. 8 is a high-level flow of operations performed with an apparatus such as depicted in FIG. 2 or 6. At step S5, input signals are synthetized thanks to a synthesizer (not shown) of a signal generator, itself controlled by a controller, so as to concomitantly apply S10, S30 a first current signal to an aggressor and a compensation signal to a shielding circuit. Another signal is timely applied S20 to the victim component, if necessary. Output signals are duly collected S40, e.g., by the controller. Such steps repeat as necessary to perform quantum computations.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

2.2.9 FIG. 9

Figure 9:
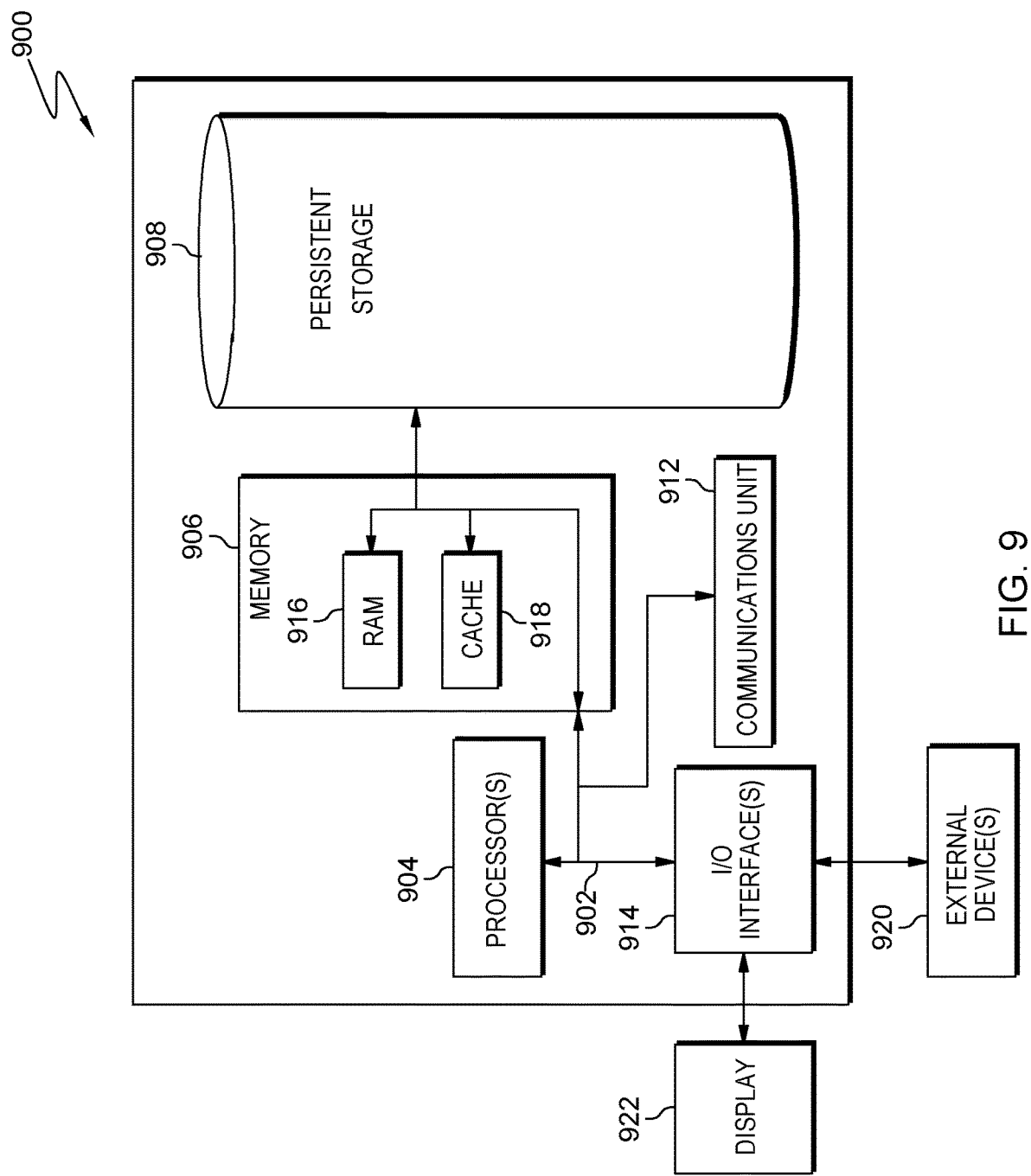
FIG. 9 is a block diagram depicting components of a computer, generally designated 900, suitable for carrying out operations to reduce an impact of stray magnetic fields on components of a quantum computing chip in accordance with at least one embodiment of the present invention. For example, computer 900 may be representative of the various computing components included in FIG. 1, FIG. 2, and FIG. 6 and that implements various processes, such as those described with respect to FIG. 8, in accordance with various embodiments of the present invention.

FIG. 9 is a block diagram depicting components of a computing device, generally designated 900, suitable for carrying out operations to reduce an impact of stray magnetic fields on components of a quantum computing chip in accordance with at least one embodiment of the present invention. Computing device 900 includes one or more processor(s) 904 (including one or more computer processors), communications fabric 902, memory 906 including, RAM 916 and cache 918, persistent storage 908, communications unit 912, I/O interface(s) 914, display 922, and external device(s) 920. It should be appreciated that FIG. 9 provides only an illustration of one embodiment and does not imply any limitations with regard to the environments in which different embodiments may be implemented. Many modifications to the depicted environment may be made.

As depicted, computing device 900 operates over communications fabric 902, which provides communications between computer processor(s) 904, memory 906, persistent storage 908, communications unit 912, and input/output (I/O) interface(s) 914. Communications fabric 902 can be implemented with any architecture suitable for passing data or control information between processor(s) 904 (e.g., microprocessors, communications processors, and network processors), memory 906, external device(s) 920, and any other hardware components within a system. For example, communications fabric 902 can be implemented with one or more buses.

Memory 906 and persistent storage 908 are computer readable storage media. In the depicted embodiment, memory 906 includes random-access memory (RAM) 916 and cache 918. In general, memory 906 can include any suitable volatile or non-volatile one or more computer readable storage media.

Program instructions for reducing an impact of stray magnetic fields on components of a quantum computing chip in accordance with embodiments of the present invention can be stored in persistent storage 908, or more generally, any computer readable storage media, for execution by one or more of the respective computer processor(s) 904 via one or more memories of memory 806. Persistent storage 908 can be a magnetic hard disk drive, a solid-state disk drive, a semiconductor storage device, read-only memory (ROM), electronically erasable programmable read-only memory (EEPROM), flash memory, or any other computer readable storage media that is capable of storing program instructions or digital information.

Media used by persistent storage 908 may also be removable. For example, a removable hard drive may be used for persistent storage 908. Other examples include optical and magnetic disks, thumb drives, and smart cards that are inserted into a drive for transfer onto another computer readable storage medium that is also part of persistent storage 908.

Communications unit 912, in these examples, provides for communications with other data processing systems or devices. In these examples, communications unit 912 can include one or more network interface cards. Communications unit 912 may provide communications through the use of either or both physical and wireless communications links. In the context of some embodiments of the present invention, the source of the various input data may be physically remote to computing device 900 such that the input data may be received, and the output similarly transmitted via communications unit 912.

I/O interface(s) 914 allows for input and output of data with other devices that may operate in conjunction with computing device 900. For example, I/O interface(s) 914 may provide a connection to external device(s) 920, which may be as a keyboard, keypad, a touch screen, or other suitable input devices. External device(s) 920 can also include portable computer readable storage media, for example thumb drives, portable optical or magnetic disks, and memory cards. Software and data used to practice embodiments of the present invention can be stored on such portable computer readable storage media and may be loaded onto persistent storage 908 via I/O interface(s) 914. I/O interface(s) 914 also can similarly connect to display 922. Display 922 provides a mechanism to display data to a user and may be, for example, a computer monitor.

What is claimed is:

1. A computer-implemented method of reducing an impact of stray magnetic fields on components of a quantum computing chip, the method comprising:

applying a first current signal to a first component of a quantum computing chip, whereby the first component generates a stray magnetic field impacting an operation of a second component of the quantum computing chip; and applying a compensation current signal to a shielding circuit of the quantum computing chip, the compensation current signal generated according to a predetermined function of the first current signal, to magnetically shield the second component from the stray magnetic field generated by the first component.

2. The computer-implemented method according to claim 1, wherein:

an amplitude of the compensation current signal applied to the shielding circuit is equal to an amplitude of the first current signal applied to the first component of the quantum computing chip.

3. The computer-implemented method according to claim 1, wherein:

a frequency and phase of the compensation current signal applied to the shielding circuit is synchronized with a frequency and phase of the first current signal applied to the first component of the quantum computing chip.

4. The computer-implemented method according to claim 1, wherein an amplitude of the compensation current signal applied to shielding circuit has an amplitude that is scaled with respect to an amplitude of the first current signal applied to the first component of the quantum computing chip.

5. The computer-implemented method according to claim 1, wherein:
the first component is one of a superconducting computational qubit and a tunable coupler; and
the computer-implemented method of claim 1 further comprises applying a first current signal to the first component of the quantum computing chip to drive the first component.

6. The computer-implemented method according to claim 1, wherein:
the second component is a superconducting computational qubit; and
the computer-implemented method of claim 1 further comprises applying a second signal to the second component of the quantum computing chip to drive the second component.

7. A computer system for reducing an impact of stray magnetic fields on components of a quantum computing chip, comprising:
one or more computer processors;
one or more computer readable storage media; and
computer program instructions, the computer program instructions being stored on the one or more computer readable storage media for execution by the one or more computer processors, the computer program instructions including instructions to:
apply a first current signal to a first component of a quantum computing chip to operate the first component, whereby operation of the first component generates a stray magnetic field impacting an operation of a second component of the quantum computing chip, and
apply a compensation current signal to a shielding circuit of the quantum computing chip that, the compensation current signal generated according to a predetermined function of the first current signal, to magnetically shield the second component from the stray magnetic field generated by the first component.

8. A quantum computing apparatus, comprising:
a qubit unit including a shielding circuit, a first component, and a second component; and
a control unit operatively connected to each of the first component and the shielding circuit, to apply:
a first current signal to a first component of a quantum computing chip to operate the first component, whereby operation of the first component generates a stray magnetic field impacting an operation of a second component of the quantum computing chip, and
a compensation current signal to a shielding circuit of the quantum computing chip, the compensation current signal generated according to a predetermined function of the first current signal, to magnetically shield the second component from the stray magnetic field generated by the first component.

9. The quantum computing apparatus according to claim 8, wherein:
the quantum computing chip further includes a first circuit and a second circuit;
the control unit is connected to the first component and the second component via the first circuit and the second circuit, respectively, and is configured to apply the first current signal to the first component via the first circuit; and
the shielding circuit is connected to the first circuit to enable the predetermined function of the first current signal.

10. The quantum computing apparatus according to claim 9, wherein:
the qubit unit is a superconducting qubit unit that includes at least a portion of each of the first circuit, the second circuit, and the shielding circuit; and
the control unit includes a signal generator connected to each of the shielding circuit and the first component, the signal generator being connected to the first component via the first circuit.

11. The quantum computing apparatus according to claim 10, wherein:
the shielding circuit and the first circuit are connected in parallel to the signal generator.

12. The quantum computing apparatus according to claim 10, wherein
the signal generator is connected to the first circuit, to which the shielding circuit is connected in series, in the qubit unit.

13. The quantum computing apparatus according to claim 10, wherein:
the quantum computing apparatus further includes one of a capacitive voltage divider or a transmission line coupler; and
the signal generator is connected to each of the shielding circuit and the first component via the capacitive voltage divider or the transmission line coupler, so as to enable the predetermined function of the first current signal.

14. The quantum computing apparatus according to claim 8, wherein:
an amplitude of the compensation current signal applied to the shielding circuit is equal to an amplitude of the first current signal applied to the first component of the quantum computing chip.

15. The quantum computing apparatus according to claim 8, wherein:
each of the first component and the second component includes at least one component selected from the group consisting of: a superconducting qubit, a tunable coupler, and a Josephson junction.

16. The quantum computing apparatus according to claim 8, wherein:
the first component includes a fixed frequency superconducting qubit of the transmon type, and the second component includes a tunable coupler coupled to the superconducting qubit of the transmon type.

17. The quantum computing apparatus according to claim 8, wherein:
the first component and the second component are arranged on a same plane in the qubit unit;
the shielding circuit includes one or more loops, each surrounding at least one of the first component and the second component in a given plane in the qubit unit; and
the given plane coincides with or is parallel to the same plane.

18. The quantum computing apparatus according to claim 17, wherein:
at least one of the one or more loops of the shielding circuit surrounds the second component in the given plane.

19. The quantum computing apparatus according to claim 17, wherein:
- the shielding circuit includes both a compensation circuit and a shaping circuit connected in series;
- the compensation circuit includes the one or more loops; and
- the shaping circuit includes two or more additional loops, each surrounding the first component in the given plane.

20. The quantum computing apparatus according to claim 19, wherein:
- the one or more loops surround the additional two or more loops in the given plane; and
- the compensation circuit and the shaping circuit are jointly designed so as for a current flowing in the shielding circuit to have a same rotation direction in the two or more additional loops, the same rotation direction opposite to a rotation direction of the current flowing in the one or more loops, as per the compensation current signal applied to the shielding circuit, in operation.

\* \* \* \* \*